(12) United States Patent
Chien et al.

(10) Patent No.: US 6,392,004 B1
(45) Date of Patent: *May 21, 2002

(54) POLYIMIDES FOR HIGH-FREQUENCY APPLICATIONS

(75) Inventors: Bert T. Chien, Minneapolis; Stephen A. Ezzell, Woodbury, both of MN (US)

(73) Assignee: 3M Innovative Properties Company, Saint Paul, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/642,849

(22) Filed: Aug. 21, 2000

(51) Int. Cl.[7] .............. C08G 73/10; G02F 1/1335; B01D 71/64
(52) U.S. Cl. .............. 528/170; 528/128; 528/172; 528/173; 528/176; 528/183; 528/185; 528/220; 528/229; 528/353; 528/125; 343/700 R; 343/785; 343/911 R; 385/129; 385/130; 385/141; 385/145; 428/1.1; 428/1.26; 428/473.5; 428/901
(58) Field of Search .............. 528/125, 128, 528/170, 172, 173, 176, 183, 185, 220, 229, 350, 353; 343/700 R, 785, 911 R; 385/129, 130, 141, 145; 428/1.1, 1.26, 473.5, 901

(56) References Cited

U.S. PATENT DOCUMENTS

| | | | |
|---|---|---|---|
| 3,758,434 A | 9/1973 | Kunzel et al. | 260/30.2 |
| 5,145,937 A | 9/1992 | Hergenrother et al. | 528/125 |
| 5,145,942 A | 9/1992 | Hergenrother et al. | 528/353 |
| 5,302,692 A | 4/1994 | St. Clair et al. | 528/353 |
| 5,386,002 A | 1/1995 | Inbasekaran et al. | 528/170 |
| 5,745,984 A | 5/1998 | Cole, Jr. et al. | 29/834 |
| 5,750,641 A | 5/1998 | Ezzell et al. | 528/353 |
| 5,969,088 A | 10/1999 | Ezzell et al. | 528/353 |
| 6,084,053 A | 7/2000 | Matsubara et al. | 528/170 |

FOREIGN PATENT DOCUMENTS

| | | | |
|---|---|---|---|
| EP | 242815 A2 | * | 10/1987 |
| EP | 0 592 002 A | | 4/1994 |
| EP | 0 875 906 A | | 11/1998 |
| JP | 5-31341 | * | 9/1993 |

OTHER PUBLICATIONS

Derwent Acc–No: 1968–11052Q, Polyamides and Polyimides based on 9,9–bis 4aminophenylfluorene, Korshak, V.V., (Inst. of Hetero–Organic Sys.), –SU 198644A, 1968 the month in the date of publication is not available.*

* cited by examiner

*Primary Examiner*—P. Hampton-Hightower
(74) *Attorney, Agent, or Firm*—Philip Y. Dahl

(57) ABSTRACT

An element of a gigahertz electronic device is provided comprising a polyimide selected to have an imide equivalent weight of 375 or greater. The polyimide preferably has a dielectric loss at 12.8 GHz of 0.009 or less and a Tg of 260° C. or greater. Such elements include circuit substrates and antennas.

40 Claims, 5 Drawing Sheets

POLYIMIDES FOR HIGH-FREQUENCY APPLICATIONS

FIELD OF THE INVENTION

This invention relates to gigahertz electronic devices containing elements composed of polyimides selected for their high polyimide equivalent weight.

BACKGROUND

U.S. Pat. Nos. 5,386,002, 3,758,434, 5,750,641, 5,969,088, 6,084,053 and 5,145,942 describes polyimides, some including polyimides derived from a fluorenyl diamine.

SUMMARY OF THE INVENTION

Briefly, the present invention provides an element of a gigahertz electronic device, i.e. a device for use with radiation or electronic signals in the 1–100 GHz frequency range, comprising a polyimide having an imide equivalent weight of 375 or greater. Such elements include circuit substrates, antennas and protective coatings. The polyimide preferably demonstrates a dielectric loss at 12.8 GHz of 0.009 or less. The polyimide preferably has a Tg of 260° C. or greater. The polyimide may be cured or crosslinked, as described in co-pending U.S. patent application Ser. No. 09/642,724, filed on even date herewith.

What has not been described in the art, and is provided by the present invention, is a means of enhancing electronic properties of polyimides in the 1–100 GHz frequency range by selecting polyimides of higher imide equivalent weight.

In this application:

"cured" describes a thermally treated polymer having less solubility at a given temperature than the same polymer prior to treatment, preferably measured in regard to solvents methyl ethyl ketone, N-methylpyrrolidone or γ-butyrolactone and preferably at room temperature;

"crosslinked" describes a polymer having a network structure, typically demonstrated by insolublility even at elevated temperatures and for extended times;

"benzylic hydrogen" refers to a hydrogen atom attached to a carbon atom directly attached to an aromatic ring, e.g., any of the three methyl hydrogens of toluene, any of the two alpha hydrogens of ethyl benzene, etc.;

"polyimide" refers to a polyimide polymer unless indicated otherwise;

"a polyimide comprising a diamine" and like phrases should be understood to refer to polyimide polymers incorporating segments derived from the indicated diamine monomers, as by a polymerization including said monomers;

"diamines comprising pendent fluorenyl groups" refers to fluorenyl compounds disubstituted at the 9 position with amine-containing substituents, such as 9,9-bis(aminoaryl)fluorenes;

"polyimides comprising pendent fluorenyl groups" refers to polyimides derived at least in part from pendent-fluorenyl diamine monomers;

"C(number)" refers to a chemical moiety containing the indicated number of carbon atoms; and the term "substituted" used without reference to a particular substituent means, for a chemical species, substituted by conventional substituents which do not interfere with the desired product or process, e.g., substituents can be alkyl, alkoxy, aryl, phenyl, halo (F, Cl, Br, I), cyano, etc.

It is an advantage of the present invention to provide materials having good mechanical, optical and electrical characteristics of polyimides and additionally having improved gigahertz performance.

DETAILED DESCRIPTION OF PREFERRED EMBODIMENTS

Figure 1:
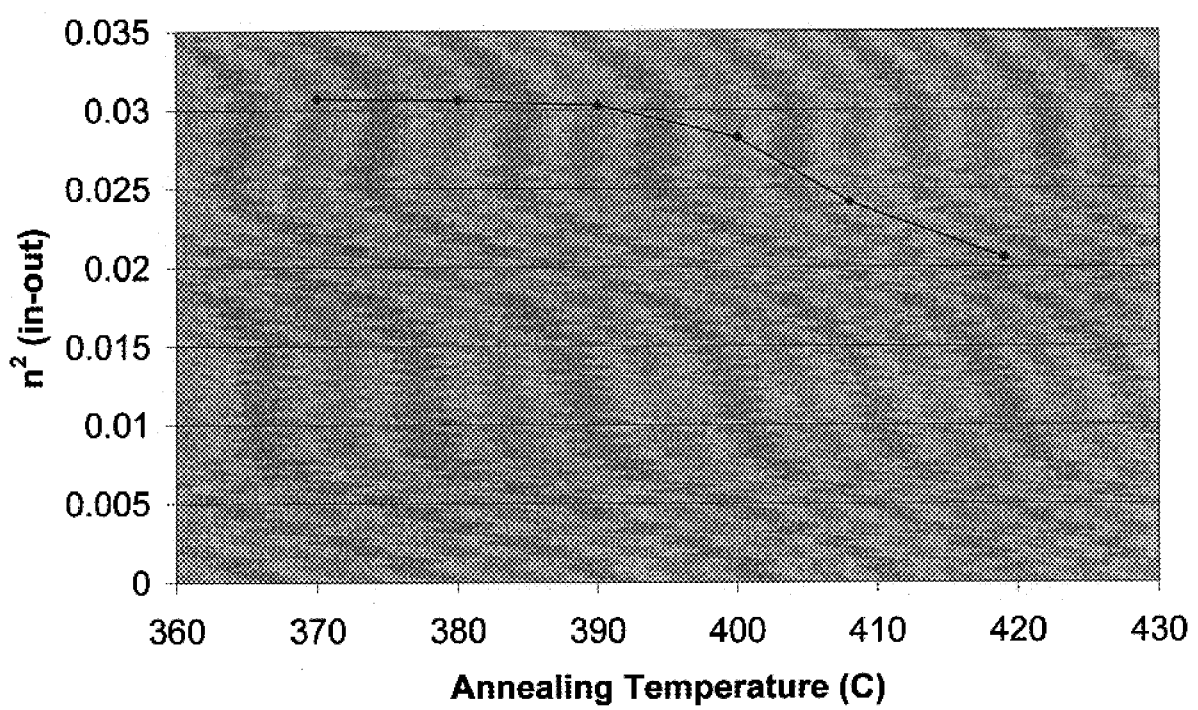
FIG. 1 is graph of curing temperature vs. measured birefringence for a sample of polyimide according to the present invention.

The present invention provides an element of a gigahertz electronic device, i.e. a device for use with radiation or electronic signals in the 1–100 GHz frequency range, comprising a polyimide having an imide equivalent weight of 375 or greater.

The gigahertz frequency range may also be called the microwave range. In the practice of the present invention, any suitable gigahertz electronic devices may be used, those adapted for telephone, satellite, and other wire and broadcast communications, as well as those adapted for cooking or heating. Electronic devices may be particularly equipped for use with radiation or electronic signals in the 1–100 GHz frequency range by any suitable means, including provision of antennas, transmission lines or other circuit elements adapted for use with 1–100 GHz radiation or signals, by provision of tuned circuits, filters or oscillators adapted for their operating characteristics in the 1–100 GHz frequency range, by provision of materials intended to measure or analyze 1–100 GHz radiation or signals, or by provision of devices allowing interaction with another device so adapted. Preferably, the electronic device is a communications device adapted to transmit or receive signals in the 1–100 GHz frequency range.

It has been found that imide equivalent weight (IEW) can be a results effective variable in lowering dielectric loss in the gigahertz range for polyimide materials. Imide equivalent weight (IEW) is defined as the atomic weight of the repeating unit of the polymer divided by the number of imide groups in the repeating unit of the polymer. Where the repeating unit varies, as in a copolymer, the average repeating unit is taken. Polyimides according to the present invention preferably have an imide equivalent weight of 375 or greater, more preferably 390 or greater, more preferably 410 or greater, and most preferably 430 or greater. Polyimides according to the present invention preferably have a dielectric loss at 12.8 GHz of 0.009 or less, as measured after equilibration to ambient conditions of 50% humidity at an air temperature of 21° C. More preferably the dielectric loss at 12.8 GHz 0.008 or less and most preferably 0.007 or less.

Without wishing to be bound by theory, it is believed that lowering IEW lowers the tendency of the polyimide to associate water. Water absorbs electromagnetic radiation strongly in the gigahertz range. It follows that the improved performance of the polyimides of the present invention is apparent under conditions of ordinary to high humidity, where consideration of water absorption is more dominant.

Polyimides according to the present invention preferably have a glass transition temperature (Tg) of 260° C. or greater, allowing their using in electronic components that may be subjected to soldering.

Polyimides according to the present invention preferably contain at least one diamine which contains a pendent fluorenyl group, preferably a 9,9-substituted fluorenyl group and more preferably a substituted or unsubstituted 9,9-bis (aminoaryl)fluorene. Preferably, the polyimide contains essentially no diamine other than fluorenyl diamines, preferably containing a 9,9-substituted fluorenyl group and more preferably a substituted or unsubstituted 9,9-bis(aminoaryl) fluorene.

Aminoaryl groups of 9,9-bis(aminoaryl)fluorenes refers to groups comprising aromatic rings bearing at least one primary amine group. Aromatic groups can be monocyclic or polycyclic and can have from 6 to about 40 carbon atoms. Preferably, the aromatic groups are monocyclic, more preferably phenyl, and are attached to the fluorene nucleus at aromatic ring positions para to the primary amine group. Either or both of the aminoaryl rings may be substituted with from 0 to 4 linear, branched or cyclic alkyl groups, halogen, or phenyl. Preferably, both rings may be substituted with 1 or 2 linear or branched alkyl groups having from 1 to 3 carbon atoms, such substitution being at any of ring positions 2, 3, 5, or 6, preferably at ring positions 3 or 5 or a combination thereof. More preferably, both aminoaryl rings can be substituted with 1 or 2 methyl or ethyl groups. Most preferably, 9,9-bis(aminoaryl)fluorenes useful in the invention include 9,9-bis(3-methyl-4-aminophenyl)fluorene, 9,9-bis(3,5-dimethyl-4-aminophenyl)fluorene, 9,9-bis(3,5-diethyl-4-aminophenyl)fluorene, and 9,9-bis(3-ethyl-5-methyl-4-aminophenyl)fluorene.

The dianhydride may be any dianhydride suitable for use in forming polyimide polymers. Preferably the dianhydride is aromatic. Aromatic tetracarboxylic acid dianhydride compounds useful in the polyimides of the present invention are those represented by Formula I,

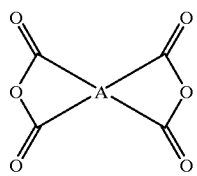

(I)

wherein A preferably contains from 6 to 40 carbon atoms and preferably contains a pyromellitic group, a polycyclic aromatic group such as naphthylene, fluorenylene, benzofluorenylene, anthracenylene, and substituted derivatives thereof, wherein the substituted groups can be alkyl having 1 to 10 carbon atoms and fluorinated derivatives thereof, and halogen such as F or Cl, and moieties of Formula II:

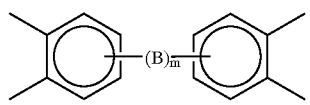

(II)

wherein B can be a covalent bond, a $C(R^2)_2$ group, a OArO group, a CO group, an O atom, an S atom, and $SO_2$ group, a $Si(C_2H_5)_2$ group or an $N(R^3)_2$ group, and combinations thereof, wherein m can be an integer of 1 to 10; each $R^2$ independently can be H or $C(R^4)_3$; each $R^3$ independently can be H, an alkyl group having from 1 to about 20 carbon atoms, or an aryl group having from about 6 to about 20 carbon atoms; Ar can be an aromatic group having from about 6 to about 40 carbon atoms, and each $R^4$ independently can be H, fluorine, or chlorine.

Representative useful dianhydrides include pyromellitic dianhydride, 3,6-diphenylpyromellitic dianhydride, 3,6-bis (trifluoromethyl)pyromellitic dianhydride, 3,6-bis(methyl) pyromellitic dianhydride, 3,6-diiodopyromellitic dianhydride, 3,6-dibromopyromellitic dianhydride, 3,6-dichloropyromellitic dianhydride, 3,3', 4,4'-benzophenonetetracarboxylic acid dianhydride, 2,3,3',4'-benzophenonetetracarboxylic acid dianhydride, 2,2'3,3'-benzophenonetetracarboxylic acid dianhydride, 3,3',4,4'-biphenyltetracarboxylic acid dianhydride, bis(2,3-dicarboxyphenyl)methane dianhydride, bis(2,5,6-trifluoro-3,4-dicarboxyphenyl)methane dianhydride, 2,2-bis(3,4-dicarboxyphenyl)propane dianhydride, 2,2'-bis(3,4-dicarboxyphenyl)hexafluoropropane dianhydride (6FDA), bis(3,4-dicarboxyphenyl)ether dianhydride, 4,4'-oxydi (phthalic anhydride), 3,3',4,4'-diphenylsulfonetetracarboxylic acid dianhydride, 4,4'-{4,4'-isopropylidene-di(p-phenyleneoxy)}-bis(phthalic anhydride), N,N-(3,4-dicarboxyphenyl)-N-methylamine dianhydride, bis(3,4-dicarboxyphenyl)diethylsilane dianhydride, naphthalene tetracarboxylic acid dianhydrides such as 2,3,6,7-and 1,2,5,6-naphthalenetetracarboxylic acid dianhydrides, 2,6-dichloronaphthalene-1,4,5,8-tetracarboxylic acid dianhydride, and heterocyclic aromatic tetracarboxylic acid dianhydrides such as thiophene-2,3,4, 5-tetracarboxylic acid dianhydride, pyrazine-2,3,5,6-tetracarboxylic acid dianhydride, pyridine-2,3,5,6-tetracarboxylic acid dianhydride, and 2,2 bis[4-(3,4-dicarboxyphenoxy)phenyl]propane dianhydride, also called bisphenol A di(phthalic anhydride) (BPADA).

The polyimide may be made by any suitable method. Suitable methods are described in the Examples below and in C. E. Sroog, *Prog. Polym. Sci.*, 16, pp 561–694 (1991) and U.S. Pat. No. 5,750,641, both of which are incorporated herein by reference.

The polyimide preferably has a number average molecular weight (Mn) of between 1,000 and 200,000, more preferably between 10,000 and 100,000.

Preferably the polyimides according to the present invention exhibit curing and crosslinking behavior as described in copending patent application Ser. No. 09/642,724. The terms cure and crosslink are defined above. The polyimides according to the present invention become crosslinked when heated to temperatures approaching or in excess of Tg. However, curing is observed to begin at lower temperatures.

The polyimide may be cured thermally. The uncured polyimide is preferably heated to a temperature sufficient to produce loss of solubility. Preferably the curing temperature is about 200° C. or greater, more preferably about 300° C. or greater, more preferably about 350° C. or greater, and most preferably about 390° C. or greater. Preferably curing is performed under an inert atmosphere such as nitrogen. Preferably curing is accomplished during a heating step of no longer than ten hours, more preferably no longer than one hour, and most preferably no longer than 40 minutes. Preferably the polyimide is processed before curing, e.g. into fibers, particles, or most preferably into a film. Preferably the film is formed by casting the polyimide from solution.

Crosslinking of the polyimide may be accomplished by any suitable method, but preferably by thermal crosslinking. The uncrosslinked polyimide is preferably heated to a temperature equal to or greater than 20° C. below Tg, more preferably a temperature equal to or greater than 10° C. below Tg, and most preferably a temperature equal to or greater than Tg. Preferably the crosslinking curing temperature is about 350° C. or greater, more preferably about 370° C. or greater, more preferably about 390° C. or greater, and most preferably about 400° C. or greater. Preferably crosslinking is performed under an inert atmosphere such as nitrogen. Preferably crosslinking is accomplished during a heating step of no longer than ten hours, more preferably no longer than one hour, and most preferably no longer than 40 minutes. Preferably the polyimide is processed before crosslinking, e.g. into fibers, particles, or most preferably into a film. Preferably the film is formed by casting the polyimide from solution.

The cured polyimide films are preferably insoluble to the extent that stirring in one of methyl ethyl ketone, N-methylpyrrolidone or γ-butyrolactone, produces substantially no dissolution of the polyimide and more preferably no visible dissolution of the polyimide at all, after 15 minutes at 25° C. and preferably even after 1 hour at 25° C.

The crosslinked polyimide films are preferably insoluble even when immersed in N-methylpyrrolidone at 100° C. for a period 2 days.

Polyimides according to the present invention preferably have excellent electrical properties, particularly at microwave frequencies, approximately 1–100 GHz. Preferably the polyimides according to the present invention have a dielectric constant at 12.8 GHz of 3.0 or less, more preferably 2.8 or less, and more preferably 2.6 or less. Preferably dielectric constants are maintained in the desired range even after equilibration to ambient conditions, such as the test conditions described below of 50% humidity at an air temperature of 21° C. Preferably the polyimides according to the present invention have a dielectric loss at 12.8 GHz of 0.012 or less, more preferably 0.009 or less, more preferably 0.008 or less, and most preferably 0.007 or less. Preferably dielectric loss is maintained in the desired range even after equilibration to ambient conditions, such as the test conditions described below of 50% humidity at an air temperature of 21° C.

The polyimides according to the present invention preferably demonstrate high mechanical stability, as represented by a low thermal expansion coefficient, especially when cured or crosslinked. The materials according to the present invention preferably have a thermal expansion coefficient at zero applied strain of 60 ppm/° C. or less, more preferably 40 ppm/° C. or less, and most preferably 20 ppm/° C. or less, these coefficients preferably holding true over a temperature range from 25° C. to 100° C., more preferably from 25° C. to 200° C., and most preferably from 25° C. to 260° C.

Preferably the polyimides according to the present invention used in the manufacture of an element of a gigahertz electronic device, and particularly in applications where known polyimides cannot be obtained in layers of sufficient thickness. Preferably the element This invention is useful as a optical or dielectric material in gigahertz electronic devices and electronic packaging.

Objects and advantages of this invention are further illustrated by the following examples, but the particular materials and amounts thereof recited in these examples, as well as other conditions and details, should not be construed to unduly limit this invention.

EXAMPLES

Materials

Unless otherwise noted, all chemicals and reagents were obtained or are available from Aldrich Chemical Co., Milwaukee, Wis.

In the following Examples, 9,9-bis(3-methyl-4-aminophenyl)fluorene (OTBAF) was prepared as described in U.S. Pat. No. 4,684,678, Example 2. It was recrystallized from anhydrous dichloroethane prior to use. p-Phenylenediamine (PDA) was obtained in a sublimed, zone-refined form from Aldrich Chemical Co. (Milwaukee, Wis.). 9,9-bis(4-aminophenyl)fluorene (BAF) was obtained from Shinetsu Chemicals Co., Ltd., Tokyo, Japan. 2,5-Dimethyl(p-phenylenediamine) (DMPDA) was obtained from Aldrich and recrystallized from absolute ethanol prior to use. 3,3'-4,4'-Benzophenone tetracarboxylic acid dianhydride (BTDA) was purchased from Aldrich in a sublimed form. 4'-Oxydi(phthalic anhydride) (ODPA) was obtained from Occidental Chemical Corp. (Dallas, Tex.) and purified via recrystallization from anisole. Pyromellitic dianhydride (PMDA), 2,2'-bis-((3,4-dicarboxyphenyl)-hexafluoropropane dianhydride (6FDA) and 3,3'-4,4'-biphenyltetracarboxylic dianhydride (s-BPDA) were purchased and used as received from Chriskev Co. (Leawood, Kansas). 2,2'-bis-((3,4-dicarboxyphenyl)-hexafluoropropane dianhydride (6FDA) was also purchased from Clariant Co., Charlotte, N.C. 2,2 bis[4-(3,4-dicarboxyphenoxy)phenyl]propane dianhydride, also called bisphenol A di(phthalic anhydride) (BPADA) was obtained from General Electric, Mount Vernon, Ind.

Polyimide Synthesis

Polyimides 1–8 were made using the monomers indicated in Table I. Table II represents the structures of polyimides 1–8.

TABLE I

| Polyimide | Diamine(s) (mol %) | Dianhydride(s) (mol %) | Tg, ° C. | IEW |
|---|---|---|---|---|
| 1 | OTBAF (50%) | BTDA (50%) | 385 | 331.36 |
| 2 | OTBAF (25%) DMPDA (25%) | 6FDA (50%) | 382 | 332.30 |
| 3 | OTBAF (50%) | 6FDA (50%) | 380 | 392.35 |
| 4 | OTBAF (50%) | ODPA (50%) | 380 | 325.35 |
| 5 | OTBAF (50%) | PMDA (15%) 6FDA (35%) | 408 | 372.25 |
| 6 | OTBAF (25%) PDA (25%) | 6FDA (50%) | 378 | 325.25 |
| 7 | OTBAF (50%) | BPADA (50%) | 254 | 430.50 |
| 8 | OTBAF (50%) | BPDA (50%) | 380 | 317.35 |

TABLE II

| Polyimide | Structure |
|---|---|
| 1 | OTBAF — BTDA |
| 2 | OTBAF — 6FDA — DMPDA |
| 3 | OTBAF — 6FDA |
| 4 | OTBAF — ODPA |

TABLE II-continued

| Polyimide | Structure |
|---|---|
| 5 | *(structure showing PMDA — OTBAF — 6FDA segments)* |
| 6 | *(structure showing OTBAF — 6FDA — PDA segments)* |
| 7 | *(structure showing OTBAF — BPADA segments)* |

TABLE II-continued

| Polyimide | Structure |
|---|---|
| 8 | 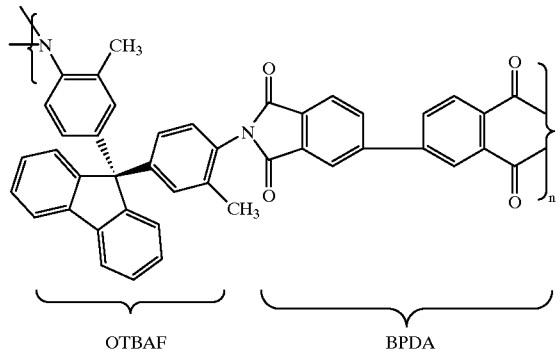 OTBAF — BPDA |

The polyimides were synthesized following a modification of information disclosed in C. E. Sroog, *Prog. Polym. Sci.*, 16, pp 561–694 (1991). The syntheses are disclosed in detail below. Additional detail can be found in U.S. Pat. No. 5,750,641, which is incorporated herein by reference.

The polyimides were synthesized as follows. About 150 g of the indicated monomers in the indicated ratios were charged as powders directly into a one liter three-neck reaction flask equipped with a mechanical stirrer, nitrogen inlet and bubbler, heating mantle, and temperature controller.

The reactor was sealed and 560 cc N,N-dimethylacetamide (DMAC) was added. Stirring was begun under a steady nitrogen purge. After several hours of stirring at room temperature, a light yellow, viscous poly(amic acid) solution was obtained. After stirring for four hours, acetic anhydride (65.1 g) was added dropwise to the polyamic acid solution, followed by pyridine (44.1 g), also added dropwise. The reaction was heated to 120° C. and held for 45 minutes, then for one hour at 100° C. The resultant cyclized polyimide remained in solution throughout. The solution was cooled to room temperature overnight, and then the crude polyimide was coagulated by slowly pouring the DMAC solution into methanol, in a blender. The precipitated polymer was obtained by filtration onto a large, coarse-fitted Buchner funnel and washed with 8–12 liters (2–3 gallons) of methanol. This extensive washing was necessary to free the material of DMAC, pyridine, and other by-products. The washed polymer was then vacuum-dried at 60° C. overnight; the final product was a white powder. Films of this material were prepared via solvent-coating from a variety of solvents.

The glass transition temperatures (Tg) reported in Table I above were measured as discussed below under the heading Thermomechanical Properties.

The imide equivalent weights (IEW) was calculated using the chemical formulas of the polymers and known atomic weight data.

Crosslinking

For polyimides 1–8 synthesized above, four grams of polyimide powder were dissolved in 16 g of cyclopentanone to prepare a 20 wt % polyimide solution. The solution was coated on a Kapton™ film (manufactured by Du Pont Co., Wilmington, Del.) using a knife coater having a gap of 300 $\mu$m, and then dried overnight in an oven at 80° C. to obtain a crosslinkable polyimide film having a film thickness of about 40 $\mu$m.

The film was heated in an oven at 400° C. under a nitrogen atmosphere for 30 minutes to obtain the solvent-resistant polyimide film of this example.

The crosslinked polyimide film was cut into a 2 cm-square sample, which was put in a reagent bottle filled with methyl ethyl ketone (MEK) and stirred for about one hour. The film was not dissolved. Deterioration (e.g., brittleness, etc.) of the film was not observed. Solvent resistance was similarly demonstrated with NMP and γ-butyrolactone. The film was not dissolved with either solvent.

Additional Curing Examples

Additional examples were run to examine the temperature dependence of the curing phenomenon.

For each of polyimides 1–7 synthesized above, 40 $\mu$m to 50 $\mu$m thick polyimide films were prepared by dissolving the polymer in a 20 weight percent (wt %) N-methylpyrrolidone (NMP) solution. The solutions were cast on 125 $\mu$m thick Kapton film (available from Du Pont, Wilmington, Del.) using a knife coater with an adjustable gap distance. A gap distance of 270 $\mu$m resulted in a 40 $\mu$m thick cast polyimide (PI) film. The cast polyimide solution was dried in an oven held at 50° C. overnight (about 16 hours). Samples of polyimide film 10 cm by 10 cm were cut from the dried material. The PI film was then fixed onto a rectangular glass substrate with two clips securing each side. Each PI film sample was cured at 300° C., 350° C., or 400° C. for 30 minutes in a nitrogen atmosphere. This heat curing shrank the samples a small amount.

After curing, 1 cm by 3 cm samples were cut from the cured PI film. The samples were soaked for one hour in 10 cc bottles filled with methyl ethyl ketone (MEK), N-methylpyrrolidone (NMP), or γ-butyrolactone (GBL). After soaking, the samples were removed from the solvent and the film conditions were visually inspected for cracks, then the samples were creased to evaluate brittleness properties. The uncrosslinked parent polymers were also subjected to the same solubility testing. Tables III through VI show the solubility results for these films along with the solubility behavior of the parent polyimide powder with no thermal treatment for comparison. Soluble samples were indicated with the designation "S", gel-forming samples by "G", insolubles by "I", and insoluble but brittle film by "I,B".

TABLE III

Parent Polyimide Powder Solubility

| Polyimide | MEK | NMP | GBL |
|---|---|---|---|
| 1 | I | S | S |
| 2 | S | S | S |
| 3 | G | S | S |
| 4 | I | S | S |
| 5 | S | S | S |
| 6 | S | S | S |
| 7 | I | S | S |

TABLE IV

300° C. for 30 min under $N_2$; ~50 μm free-standing film

| Polyimide | MEK | NMP | GBL |
|---|---|---|---|
| 1 | I | I,B | I,B |
| 2 | S | S | S |
| 3 | S | S | S |
| 4 | I | I,B | I,B |
| 5 | G | S | S |
| 6 | S | S | S |
| 7 | I | I | I |

TABLE V

350° C. for 30 min under $N_2$; ~50 μm free-standing film

| Polyimide | MEK | NMP | GBL |
|---|---|---|---|
| 1 | I,B | I,B | I,B |
| 2 | S | G | G |
| 3 | S | G | G |
| 4 | I | I,B | I,B |
| 5 | G | I,B | I,B |
| 6 | S | I,B | I,B |
| 7 | I | I | I |

TABLE VI

400° C. for 30 min under $N_2$; ~50 μm free-standing film

| Polyimide | MEK | NMP | GBL |
|---|---|---|---|
| 1 | I | I,B | I,B |
| 2 | I | I | I |
| 3 | I | I | I |
| 4 | I | I,B | I,B |
| 5 | I | I | I |
| 6 | I | I | I |
| 7 | I | I | I |

Crosslinking on Aluminum Substrate

The above tests were repeated for polyimides 2, 3, and 7, each constrained on aluminum. Sample preparation and testing follows: Aluminum substrate material 100 mm by 100 mm and 2 mm thick was sand blasted using a blast pressure of 0.35 MPa with alumina powder having an average diameter of 0.016 mm. Then the aluminum substrate was chemically etched in a solution of sodium dichromate dihydrate (4 g), sulfuric acid (40 g) and distilled water (120 g). The substrate material was soaked in this solution (maintained at 63 to 67° C.) for 2 hours, rinsed with DI water and dried. A 1 wt % solution of 3-aminopropyltriethoxysilane adhesion promoter (from Shinetsu Chemicals, Tokyo, Japan) in a base of 90% ethanol and 10% water, was spin-coated onto the aluminum substrate, then dried in air at 120° C. for 30 min.

The polyimide powders were dissolved in cyclopentanone to yield a 20 wt % solution. The solution of each composition was coated onto the aluminum substrate (prepared as described above) using a knife coater with a 500 μm gap. The polyimide-coated aluminum substrates were dried in a 50° C. oven overnight (about 16 hours) to remove any cyclopentanone. Then the samples were cured using a temperature cycle heating from room temperature to 400° C. over about 30 minutes, holding at 400° C. for 1 hour, then cooling to room temperature over about 60 minutes. A nitrogen atmosphere was maintained in the oven. The resultant film thickness on the aluminum substrate was 80 μm. These samples of polyimide on aluminum were soaked for 2 minutes in each test solvent, to simulate a photoresist stripping process. The results are indicated in Table VII.

TABLE VII

| | Polyimide | | |
|---|---|---|---|
| Solvent | 2 | 3 | 7 |
| methyl isobutyl ketone (MIBK) | I | I | I,B |
| NMP | I | I | I,B |
| g-butyrolactone | I | I | I,B |
| cyclohexanone | I | I | I |
| ethyl acetate | I | I,B | I, B |

Structural Basis of Polyimide Crosslinking

Additional examples were run to examine the structural basis of the curing phenomenon.

Polyimide compositions with structural variations in the fluorenyl diamine residue were studied in order to demonstrate the cause of the crosslinking behavior. The structures are shown in Formula III and Table VII. Polyimides were formed according to the procedure described above. Comonomer PDA, Formula IV, was added as indicated in Table VIII. Films were prepared by solvent casting, then curing at 390° C. under nitrogen for 20 minutes. As a test for true crosslinking, cured films were immersed in NMP at 100° C. for a period 2 days and the solubility observed. In Table VIII, "yes" means the sample neither dissolved nor swelled. A "no" means the sample dissolved.

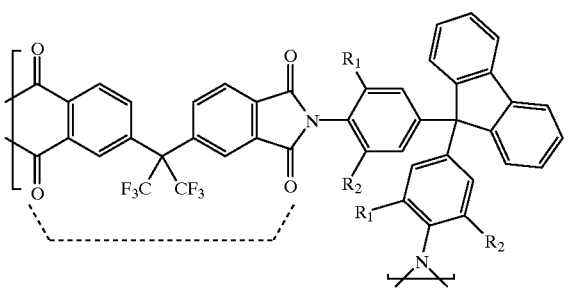

(III)

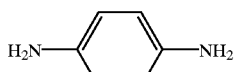

(IV)

TABLE VIII

| $R_1$ | $R_2$ | Comonomer | Crosslinked |
|---|---|---|---|
| —CH$_2$CH$_3$ | —CH$_2$CH$_3$ | none | yes |
| —CH$_3$ | —H | none | yes |
| —CH$_3$ | —CH$_2$CH$_3$ | none | yes |
| —H | —H | none | no |
| —H | —H | PDA | no |

This example suggests that true crosslinking occurs with cure at 390° C. and that the feature that enables the crosslinking process is the alkylaromatic group. Where no alkyl substituent was present the material did not crosslink. Addition of a comonomer without an alkylaromatic group did not affect this trend. However, polyimide 9, above, demonstrated that addition of a comonomer with an alkylaromatic group did result in crosslinking.

Materials Properties

The following examples demonstrate that the polyimides according to the present invention have properties useful for numerous application areas, including electronics and optoelectronics.

Dielectric Constant (1 MHz)

The out-of-plane dielectric constant (k) of polyimides 2–8 was determined by parallel plate capacitance measurements (metal-polyimide-metal). The dielectric constant was calculated with the following relation $$k = (c \times t)/(\in \times A)$$

where c=measured capacitance, t=film thickness, $\in$=permittivity of vacuum, and A=area of aluminum dot. Metal-polyimide-metal samples were prepared by spin coating polyimide films (1 to 2 μm thick with less than about 1% thickness variation per sample) on aluminized silicon wafers. The films were heat treated under nitrogen under one of two conditions: at 300° C. for 2.5 hrs. or at 400° C. for 0.5 hrs. Then, aluminum dots (0.750 mm radius) were electron beam vacuum-deposited onto the free surface of the polyimide. Since moisture absorption in films was known to increase the overall dielectric constant of a film ($k_{water}$=78.2 at 1 MHz), both the dielectric constant of "dry" films (dried at 240° C. in nitrogen for 3 hours prior to measurement) and those equilibrated in the ambient laboratory environment (21° C., 50% relative humidity) were measured. The dielectric measurements of the polyimide films in the dried state exhibited dielectric constants ranging from 2.73 to 3.05 at 1 MHz, as reported in Table IX. The change in dielectric constant with crosslinking was small, as was the change in dielectric constant with crosslinking temperature. Upon equilibration in the ambient laboratory environment the dielectric constant increased, as expected, due to the absorption of a small amount of moisture in the film (less than about 1 wt % moisture absorption was calculated from the change in dielectric constant).

TABLE IX

Dielectric Constant at 1MHz

| Polyimide | Dry film (300° C., 2.5 hrs.) | Equilibrated to ambient (300° C., 2.5 hrs.) | Dry film (400° C., 0.5 hrs.) | Equilibrated to ambient (400° C., 0.5 hrs.) |
|---|---|---|---|---|
| 2 | 2.78 | 3.10 | 2.89 | |
| 3 | 2.82 | 3.14 | 2.87 | 3.16 |
| 5 | 2.73 | 2.98 | 2.74 | 3.12 |
| 6 | 2.77 | 3.08 | 3.04 | |
| 7 | 2.96 | 3.08 | 3.05 | |
| 8 | 2.94 | 3.50 | 3.00 | 3.59 |

Dielectric Constant/loss (12.8 GHz)

The in-plane dielectric properties at 12.8 GHz of polyimides 2–8 were measured by the split post resonator technique (as described in Baker-Jarvis, et al., *IEEE Trans. on Dielectric and Electrical Insulation,* 5(4), 1998, p. 571, and Krupka, et al., Proc. 7$^{th}$ *International Conference on Dielectric Materials: Measurements and Applications,* IEEE Conference Publication No. 430, Sept. 1996).

Polyimide films 38 to 102 μm (1.5 to 4 mils) thick were cast from solution (NMP) with a doctor blade and were allowed to dry over a period of several days in nitrogen at room temperature. The films were subsequently heat treated overnight at 200° C. in vacuum followed by a second heat treatment under nitrogen atmosphere under one of three sets of conditions: 230° C. for 3.5 hours, 340° C. for 3 hours, or 400° C. for 0.5 hours. As with the 1 MHz dielectric measurements, the dielectric constant of "dried" films (dried at 230° C. in nitrogen for 3 hours and cooled to room temperature overnight in nitrogen prior to measurement) and those equilibrated in the ambient laboratory environment (21° C., 50% RH) were measured. The dielectric constant and dielectric loss of water at 10 GHz are 55.0 and 540 milliunits respectively. Tables X and XI report the measured dielectric constants.

TABLE X

Dielectric Loss (milliunits) at 12.8 GHz

| | 230° C., 3.5 hrs | | 340° C., 3 hrs | | 400° C., 30 min | |
|---|---|---|---|---|---|---|
| Polyimide | "dry" film | Equilibrated to ambient | "dry" film | Equilibrated to ambient | "dry" film | Equilibrated to ambient |
| 2 | 2.26 | 11.92 | 6.62 | 11.93 | 7.14 | 10.38 |
| 3 | 2.64 | 7.75 | 3.07 | 5.11 | | |
| 4 | 6.82 | 9.55 | | | | |
| 5 | 3.14 | 13.43 | | | | |
| 6 | 2.71 | 10.44 | | | | |
| 7 | 2.59 | 6.29 | | | | |
| 8 | 4.91 | 9.41 | | | | |

TABLE XI

Dielectric Constant at 12.8 GHz

| | 230° C., 3.5 hrs | | 340° C., 3 hrs | | 400° C., 30 min | |
|---|---|---|---|---|---|---|
| Polyimide | "dry" film | Equilibrated to ambient | "dry" film | Equilibrated to ambient | "dry" film | Equilibrated to ambient |
| 2 | 2.64 | 2.75 | 2.66 | 2.74 | 2.67 | 2.76 |
| 3 | 2.65 | 2.71 | 2.68 | 2.71 | | |
| 4 | 2.88 | 2.98 | | | | |
| 5 | 2.77 | 2.96 | | | | |
| 6 | 2.66 | 2.82 | | | | |

TABLE XI-continued

Dielectric Constant at 12.8 GHz

| Poly-imide | 230° C., 3.5 hrs | | 340° C., 3 hrs | | 400° C., 30 min | |
|---|---|---|---|---|---|---|
| | "dry" film | Equilibrated to ambient | "dry" film | Equilibrated to ambient | "dry" film | Equilibrated to ambient |
| 7 | 2.84 | 2.92 | | | | |
| 8 | 2.86 | 2.97 | | | | |

The data in Tables X and XI indicate that the materials of the present invention have excellent characteristics for use in electronic components or packaging materials for devices that operate in the gigahertz frequency range. It is notable that the dielectric constant was relatively stable throughout the crosslinking process for polymide 2.

Dielectric Constant/loss (12.8 GHz) vs. Imide Equivalent Weight (IEW)

Figure 5:
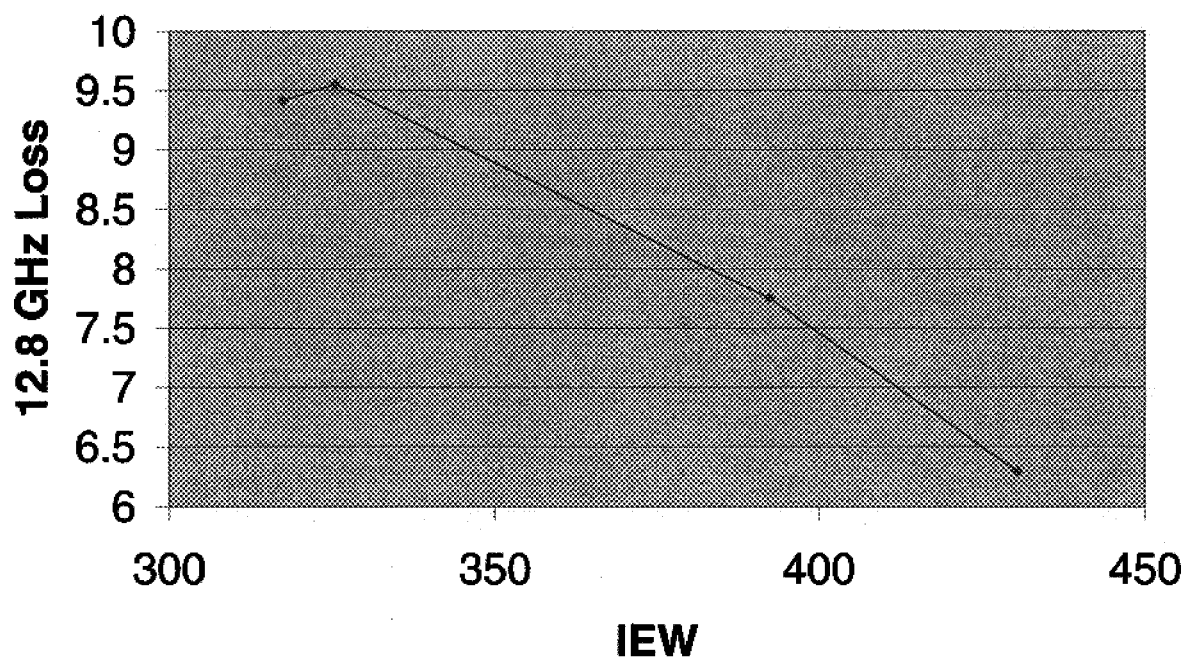
FIG. 5 is a graph of 12.8 GHz dielectric loss versus imide equivalent weight for a series of polymers of OTBAF.

FIG. 5 correlates the 12.8 GHz dielectric loss data measured at ambient conditions to IEW a series of polymers of OTBAF having increasing IEW; in order of increasing IEW, polyimides 8, 4, 3 and 7. This figure correlates data from Tables I and X. By comparing polymers of OTBAF with varying IEW, FIG. 5 demonstrates that IEW is a result effective variable to decrease 12.8 GHz dielectric loss under ambient conditions.

Comparison of polyimide 3 with polyimides 2 and 6 demonstrates the role of the fluorenyl diamine, in this case, OTBAF. All three are copolymers with 6FDA, however, some of the OTBAF content is replaced with non-fluorenyl comonomer PDA or DMPDA in polyimides 2 and 6. As a result, 12.8 GHz dielectric loss under ambient conditions is increased for polyimides 2 and 6.

Refractive Index/birefringence

In-plane ($n_{TE}$) and out-of-plane ($n_{TM}$) refractive index measurements of the polyimide films were made with a Model 2010 prism coupler (632.8 nm polarized laser light source)(Metricon Corp., Pennington, N.J.). The prism coupler was also used to determine film thickness. Measured values of $n_{TE}$ and $n_{TM}$ were used to calculate in-plane dielectric constant at 632.8 nm ($nTE^2$), out-of-plane dielectric constant at 632.8 nm ($n_{TM}2$), and birefringence ($n=n_{TE}-n_{TM}$). The polyimide films used for measurement were made by spin coating onto silicon wafers from NMP solvent. Films were made ranging in thickness from 1 to 2 µm. Across a given sample, the film thickness varied by less that 2%.

Table XII lists the in-plane ($n_{TE}$) and out-of-plane ($n_{TM}$) refractive index, the calculated birefringence ($n_{TE}-n_{TM}$) and the calculated dielectric constants ($n^2$) at 632.8 nm for films of various compositions following curing at 400° C. for 30 minutes under nitrogen.

TABLE XII

Refractive Index and Calculated Birefringence and Dielectric Constants

| Polyimide | $n_{TE}$ | $n_{TM}$ | ($n_{TE} - n_{TM}$) | $n_{TE}^2$ | $n_{TM}^2$ |
|---|---|---|---|---|---|
| 2 | 1.5743 | 1.5532 | 0.0211 | 2.4784 | 2.4124 |
| 3 | 1.5853 | 1.5795 | 0.0058 | 2.5131 | 2.4948 |
| 5 | 1.6008 | 1.5748 | 0.0260 | 2.5625 | 2.4800 |
| 6 | 1.5844 | 1.5720 | 0.0124 | 2.5103 | 2.4712 |
| 7 | 1.6412 | 1.6384 | 0.0028 | 2.6935 | 2.6844 |
| 8 | 1.6622 | 1.6480 | 0.0142 | 2.7629 | 2.7159 |

A low degree of birefringence (i.e., film anisotropy) is desirable for many electronic applications where isotropic dielectric properties are desired in the passivation of circuitry. Refractive index measurements indicate that the polyimide films have a relatively small amount of out-of-plane birefringence. Crosslinking according to the present invention further reduced out-of-plane birefringence. These results are shown in Table XIII below and in FIG. 1 for a single polyimide film sample (polyimide 2) cured at progressively higher temperatures under nitrogen atmosphere. At each temperature interval, the film was heated for an additional period of 30 minutes in nitrogen. It is notable that the refractive index and therefore the dielectric constant was relatively stable throughout the curing process. This indicated that the cure process did not degrade the dielectric properties of the film, an important attribute for electronics packaging, dielectric insulator, and other applications.

TABLE XIII

| Temp (° C.) | $\eta$ (in-plane) | $\eta$ (out-of-plane) | $\eta^2$ (in-plane) | $\eta^2$ (out-of-plane) | $\Delta\eta^2$ (in − out) |
|---|---|---|---|---|---|
| 419 | 1.5681 | 1.5615 | 2.4589 | 2.4383 | 0.0206 |
| 408 | 1.5684 | 1.5607 | 2.4599 | 2.4358 | 0.0241 |
| 400 | 1.5686 | 1.5596 | 2.4605 | 2.4323 | 0.0282 |
| 390 | 1.5688 | 1.5591 | 2.4611 | 2.4308 | 0.0303 |
| 380 | 1.5688 | 1.559 | 2.4611 | 2.4305 | 0.0306 |
| 370 | 1.569 | 1.5592 | 2.4618 | 2.4311 | 0.0307 |
| 175 | 1.5699 | 1.5474 | 2.4646 | 2.3944 | 0.0702 |

Optical Transmission

Materials demonstrating low loss at optical wavelengths are often required for optical applications.

Figure 2:
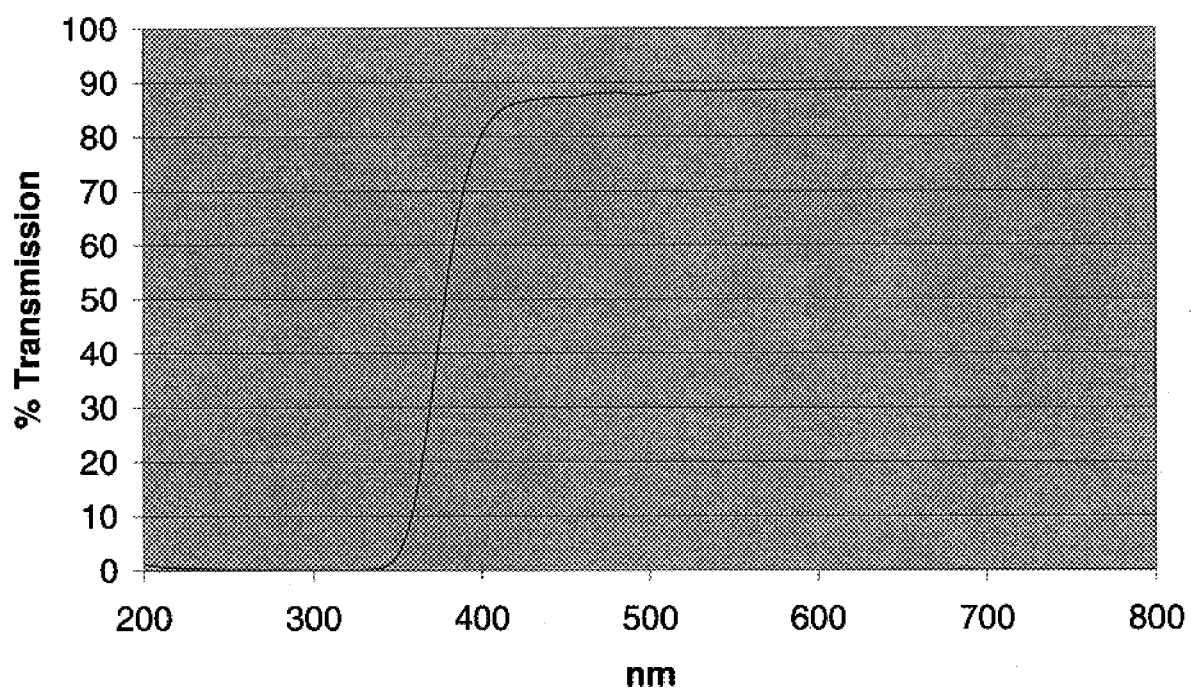
FIG. 2 is an optical transmission spectrum from 200 nm to 800 nm wavelength of a comparative uncured film of polyimide.
Figure 3:
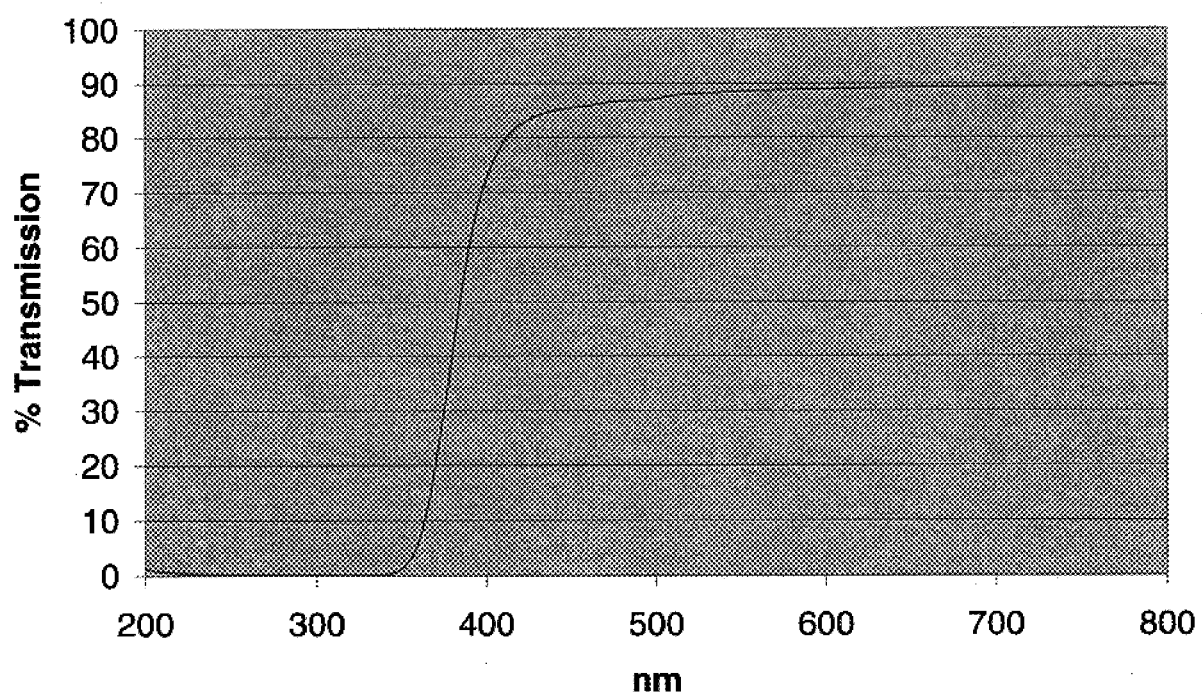
FIG. 3 is an optical transmission spectrum form 200 nm to 800 nm wavelength of a cured film of polyimide according to the present invention.
Figure 4:
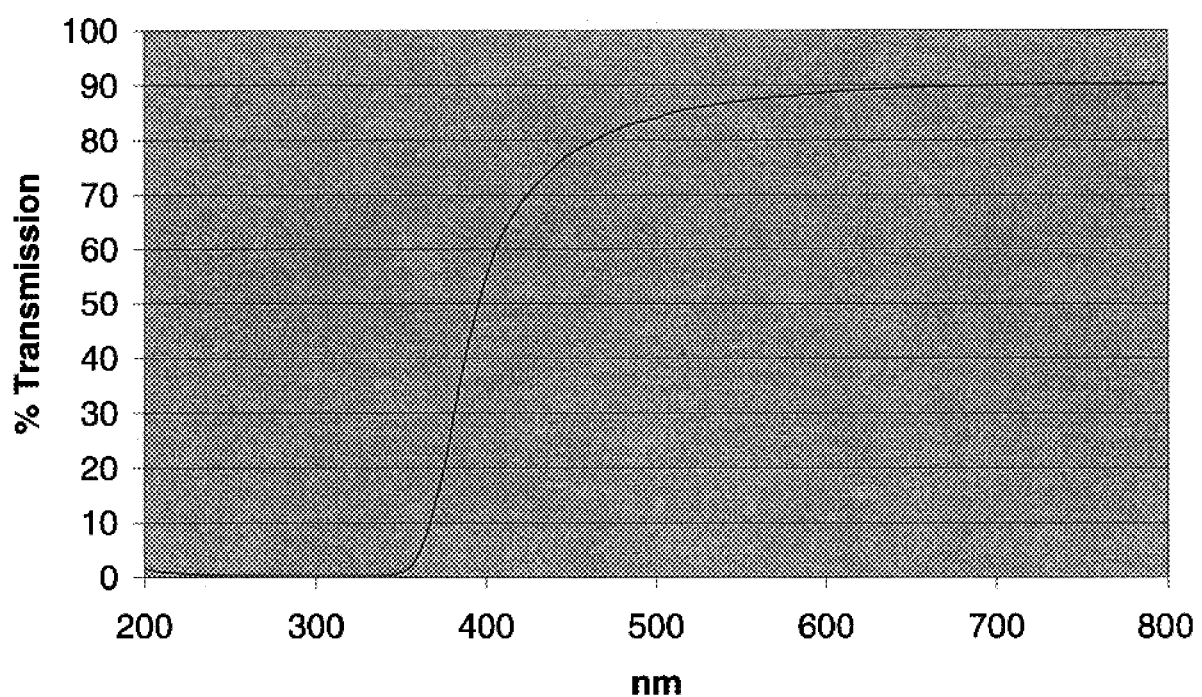
FIG. 4 is an optical transmission spectrum form 200 nm to 800 nm wavelength of a crosslinked film of polyimide according to the present invention.

Optical transmission spectra were measured for polyimides in uncured, cured, and crosslinked states using a UVNVIS/NIR Spectrometer Lambda 19 (Perkin-Elmer Analytical Inst. Co., Norwalk, Conn.). Films were cast from NMP to thicknesses of about 30–50 µm. Actual thickness was measured manually using calipers before curing and is reported in Table XIV. Comparative uncured films were allowed to dry at room temperature under nitrogen for several days. Cured films were heated to 260 ° C. under nitrogen for one hour. Crosslinked films were heated to 400 ° C. under nitrogen for 30 minutes. Films were shown to have excellent transmission above a measured cutoff point. FIGS. 2, 3 and 4 are transmission spectra obtained for polyimide 3 in uncured, cured, and crosslinked states, respectively. Table XIV lists the wavelength in nanometers at which 85% transmission was obtained for each polyimide.

TABLE XIV

| Polyimide | Uncured | Cured | Crosslinked | Thickness (µm) |
|---|---|---|---|---|
| 1 | 478 | 600 | 744 | 46 |
| 2 | 401 | 483 | 580 | 37 |
| 3 | 412 | 440 | 510 | 51 |
| 4 | 411 | 484 | 609 | 44 |
| 5 | 447 | 465 | 624 | 35 |
| 6 | 420 | 447 | 697 | 29 |
| 7 | 422 | 465 | 584 | 30 |
| 8 | 432 | 483 | 549 | 52 |

The materials according to the present invention demonstrate good optical transmission characteristics for use in telecommunication applications such as waveguides, even after crosslinking.

Thermomechanical Properties

The lateral thermal expansion coefficient of a cured film of polyimide 2 was obtained by thermomechanical analysis using a TMA 2940 Thermomechanical Analyzer (TA Instruments, Inc). The films were cured at 380° C. in nitrogen for 30 minutes. The initial dimensions of the measured films were 12.8 mm by 2 mm with a thickness of 0.030 mm. After the films were loaded into the instrument, the films were first placed under low stress (0.5 MPa) and heated to 300° C. for 30 minutes under nitrogen. 300° C. was chosen as a temperature sufficiently below Tg so that no permanent stretching or increase in molecular orientation would occur during this pretreatment. This pretreatment step is intended to relieve internal film stress, such as stresses that cause curling and the like. The actual measurements were then made under nitrogen at a scan rate of 10° C./minute. Dimensional change increases rapidly at the glass transition temperature (Tg) of the polymer, and therefore this method was also used to determine all of the Tg data reported in Table I. Measurements were made at four different applied stress levels: 1.6, 2.4, 3.1 and 4.0 MPa. These results were then extrapolated to zero applied strain. For polymer 2 cured as indicated above, the thermal expansion coefficient at zero applied strain was calculated to be 19.8 ppm/° C. over a temperature range from 25° C. to 260° C.

Various modifications and alterations of this invention will become apparent to those skilled in the art without departing from the scope and principles of this invention, and it should be understood that this invention is not to be unduly limited to the illustrative embodiments set forth hereinabove. All publications and patents are herein incorporated by reference to the same extent as if each individual publication or patent was specifically and individually indicated to be incorporated by reference.

We claim:

1. An element of an electronic device, said device being equipped for use with radiation or electronic signals in the 1–100 GHz frequency range, comprising a polyimide having an imide equivalent weight of 375 or greater.

2. The element according to claim 1, wherein said polyimide has an imide equivalent weight of 390 or greater.

3. The element according to claim 1, wherein said polyimide has an imide equivalent weight of 430 or greater.

4. The element according to claim 1, wherein said polyimide has a dielectric loss at 12.8 GHz of 0.009 or less, as measured after equilibration to ambient conditions of 50% humidity at an air temperature of 21° C.

5. The element according to claim 1, wherein said polyimide has a dielectric loss at 12.8 GHz of 0.008 or less, as measured after equilibration to ambient conditions of 50% humidity at an air temperature of 21° C.

6. The element according to claim 1, wherein said polyimide has a dielectric loss at 12.8 GHz of 0.007 or less, as measured after equilibration to ambient conditions of 50% humidity at an air temperature of 21° C.

7. An element of an electronic device, said device being equipped for use with radiation or electronic signals in the 1–100 GHz frequency range, comprising a polyimide having dielectric loss at 12.8 GHz of 0.009 or less, as measured after equilibration to ambient conditions of 50% humidity at an air temperature of 21° C.

8. The element according to claim 7, wherein said polyimide has a dielectric loss at 12.8 GHz of 0.008 or less, as measured after equilibration to ambient conditions of 50% humidity at an air temperature of 21° C.

9. The element according to claim 7, wherein said polyimide has a dielectric loss at 12.8 GHz of 0.007 or less, as measured after equilibration to ambient conditions of 50% humidity at an air temperature of 21° C.

10. The element according to claim 7, wherein said polyimide has an imide equivalent weight of 390 or greater.

11. The element according to claim 7, wherein said polyimide has an imide equivalent weight of 430 or greater.

12. The element according to claim 8, wherein said polyimide has an imide equivalent weight of 390 or greater.

13. The element according to claim 9, wherein said polyimide has an imide equivalent weight of 430 or greater.

14. The element according to claim 1, wherein said polyimide has a Tg of 260° C. or greater.

15. The element according to claim 4, wherein said polyimide has a Tg of 260° C. or greater.

16. The element according to claim 7, wherein said polyimide has a Tg of 260° C. or greater.

17. The element according to claim 1, wherein said polyimide comprises pendent fluorenyl groups.

18. The element according to claim 4, wherein said polyimide comprises pendent fluorenyl groups.

19. The element according to claim 7, wherein said polyimide comprises pendent fluorenyl groups.

20. The element according to claim 17, wherein said polyimide comprises essentially no diamine other than a substituted or unsubstituted 9,9-bis(aminophenyl)fluorene.

21. The element according to claim 18, wherein said polyimide comprises essentially no diamine other than a substituted or unsubstituted 9,9-bis(aminophenyl)fluorene.

22. The element according to claim 19, wherein said polyimide comprises essentially no diamine other than a substituted or unsubstituted 9,9-bis(aminophenyl)fluorene.

23. The element according to claim 20, wherein said polyimide comprises essentially no dianhydride other than substituted or unsubstituted bisphenol A di(phthalic anhydride) ("BPADA").

24. The element according to claim 21, wherein said polyimide comprises essentially no dianhydride other than substituted or unsubstituted bisphenol A di(phthalic anhydride) ("BPADA").

25. The element according to claim 22, wherein said polyimide comprises essentially no dianhydride other than substituted or unsubstituted bisphenol A di(phthalic anhydride) ("BPADA").

26. The element according to claim 1, wherein said polyimide is soluble in N-methylpyrrolidone (NMP).

27. The element according to claim 4, wherein said polyimide is soluble in N-methylpyrrolidone (NMP).

28. The element according to claim 7, wherein said polyimide is soluble in N-methylpyrrolidone (NMP).

29. The element according to claim 1, wherein said polyimide is cured or crosslinked.

30. The element according to claim 4, wherein said polyimide is cured or crosslinked.

31. The element according to claim 7, wherein said polyimide is cured or crosslinked.

32. The element according to claim 1 which is a substrate for an electronic circuit.

33. The element according to claim 4 which is a substrate for an electronic circuit.

34. The element according to claim 7 which is a substrate for an electronic circuit.

35. The element according to claim 1 which is an antenna.

36. The element according to claim 4 which is an antenna.

37. The element according to claim 7 which is an antenna.

38. The element according to claim 1 which is a protective coating.

39. The element according to claim 4 which is a protective coating.

40. The element according to claim 7 which is a protective coating.

* * * * *

UNITED STATES PATENT AND TRADEMARK OFFICE
CERTIFICATE OF CORRECTION

PATENT NO. : 6,392,004 B1
DATED : May 21, 2002
INVENTOR(S) : Chien, Bert T.

It is certified that error appears in the above-identified patent and that said Letters Patent is hereby corrected as shown below:

Column 2,
Lines 14 and 17, "form 200" should be -- from 200 --

Column 5,
Line 67, "thickness. Preferably the element" should read -- thinkness. --

Column 6,
Line 33, "4'-Oxydi(phthalic anhydride)" should be -- 4,4'-Oxydi(phthalic anhydride) --

Columns 7, 8, 9, 10, 11 and 12,
Replace Table II with the following Table II:

Table II

| Polyimide | Structure |
|---|---|
| 1 | 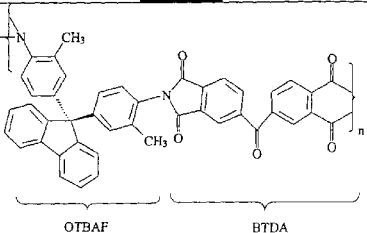 |
| 2 | 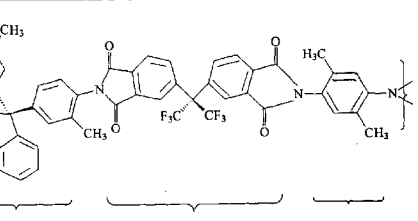 |
| 3 | 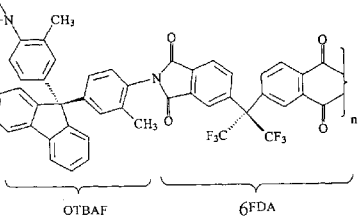 |

UNITED STATES PATENT AND TRADEMARK OFFICE
CERTIFICATE OF CORRECTION

PATENT NO. : 6,392,004 B1
DATED : May 21, 2002
INVENTOR(S) : Chien, Bert T.

It is certified that error appears in the above-identified patent and that said Letters Patent is hereby corrected as shown below:

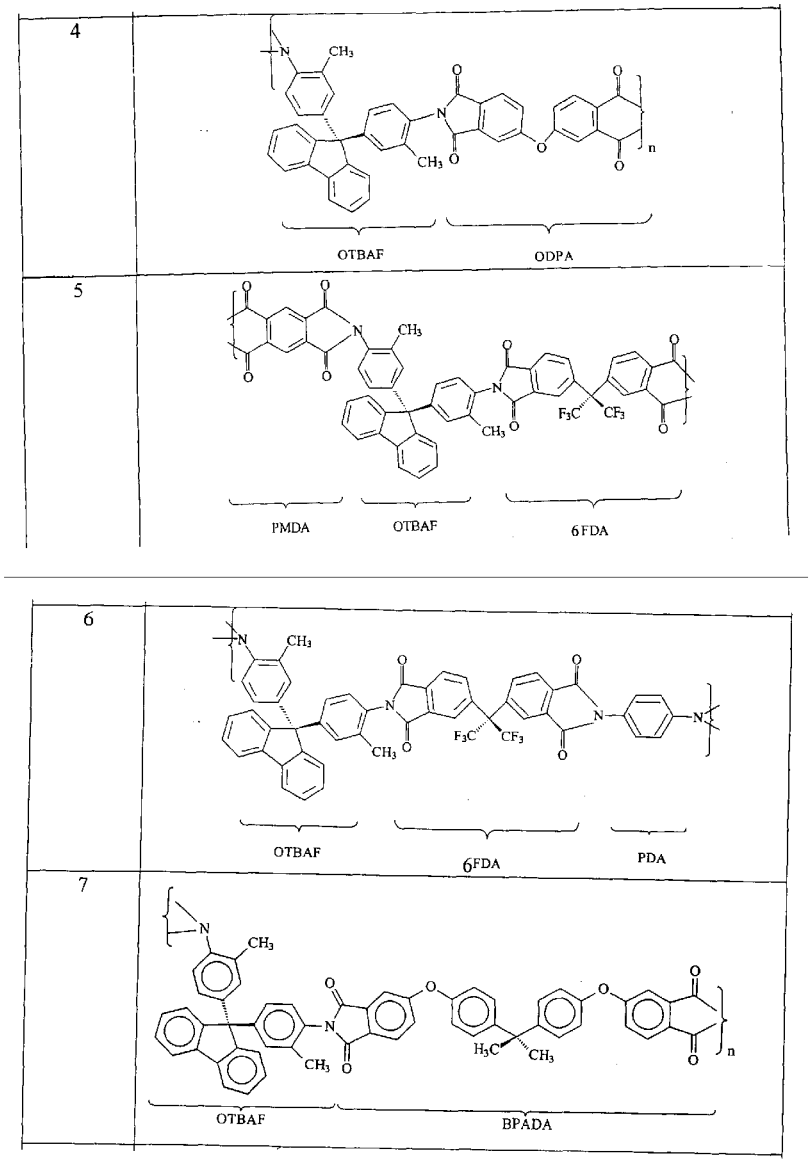

UNITED STATES PATENT AND TRADEMARK OFFICE
CERTIFICATE OF CORRECTION

PATENT NO. : 6,392,004 B1
DATED : May 21, 2002
INVENTOR(S) : Chien, Bert T.

It is certified that error appears in the above-identified patent and that said Letters Patent is hereby corrected as shown below:

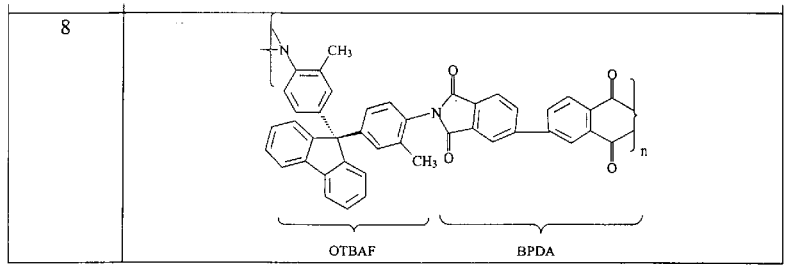

Column 14,
Line 38, "Table VII" should be -- Table VIII --
Line 48, insert before formula (III) the following: -- Parent Homopolymer Structure --
Line 61, insert before formula (IV) the following: -- PDA Comonomer --

Column 17,
Line 42, "$(nTE^2)$" should be -- $(n_{TE}^2)$ --

Column 18,
Line 34, "UVNVIS/NIR" should be -- UV/VIS/NIR --

Signed and Sealed this

Twenty-first Day of September, 2004

JON W. DUDAS
*Director of the United States Patent and Trademark Office*